US007463060B1

(12) United States Patent
Whitten et al.

(10) Patent No.: US 7,463,060 B1
(45) Date of Patent: Dec. 9, 2008

(54) PROGRAMMABLE LOGIC DEVICE AND METHOD OF TESTING

(75) Inventors: Trent Whitten, Beaverton, OR (US); Kam Fai So, Beaverton, OR (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 121 days.

(21) Appl. No.: 11/452,714

(22) Filed: Jun. 13, 2006

(51) Int. Cl.
*H03K 19/173* (2006.01)
*H03K 19/177* (2006.01)

(52) U.S. Cl. ............................ 326/40; 326/38; 326/46

(58) Field of Classification Search ............ 326/38–41, 326/46, 47
See application file for complete search history.

(56) References Cited

U.S. PATENT DOCUMENTS 5,646,546 A 7/1997 Bertolet et al.
5,732,246 A 3/1998 Gould et al.
6,208,559 B1 3/2001 Tu et al.
6,515,899 B1 2/2003 Tu et al.
6,611,463 B1 8/2003 Mehta et al.
7,023,744 B1 * 4/2006 Shimanek et al. ...... 365/189.11

OTHER PUBLICATIONS

Brian Bailey, *Verification Moves to A higher Level*, EE Times, Oct. 3, 2005; pp. 1-6.

Dong-Ho Lee, Appendix B to a dissertation, *A Power Conditioning System for Superconductive Magnetic Energy Storage Based on Multi-Level Voltage Source Converter*; Virginia Polytechnic Institute and State University, Jul. 6, 1999; 12 pages.

Wikipedia Foundation, Inc., *Field-Programmable Gate Array*, Feb. 20, 2006; 8 pages, at http://en.wikipedia.org/wiki/field-programmable_gate_array.

Lattice Semiconductor Corporation, *Power Manager: Sequencing, Monitoring, Trimming & Measurement*, undated. (via www.latticesemi.com, at http://www.latticesemi.com/products/powermanager/index.cfm?isessionid=ba30274b6255Zr$3F$3F), no date.

Texas Instruments, Application Report, *Test Consideration for PLDs*; Nov. 1999; 11 pages.

Stephen Brown and Jonathan Rose, "Architecture of FPGAs and CPLDs: A Tutorial," *IEEE Design and Test of Computers*, vol. 13, No. 2, pp. 42-57, 1996. (via http://www.eecg.toronto.edu/~jayar/pubs/brown/survey.html).

* cited by examiner

*Primary Examiner*—Daniel D Chang

(57) ABSTRACT

A programmable logic device may comprise a plurality of programmable resources and non-volatile configuration memory to store configuration data by which to configure the programmable resources. Test override circuitry may determine a test mode and selectively override the configuration data stored in the non-volatile configuration memory during the test mode for configuring the programmable resources based at least in part on test configuration data other than the configuration data stored in the non-volatile memory. A buffer may be operable to drive a configuration select node for at least one of the programmable resources for designating a configuration therefore based on the configuration data of the non-volatile memory. The test override circuitry may comprise a pull-down circuit operable, when enabled dependent on the test configuration data, to drive the buffer with a high/low level capable of overriding a state of the non-volatile configuration memory.

16 Claims, 6 Drawing Sheets

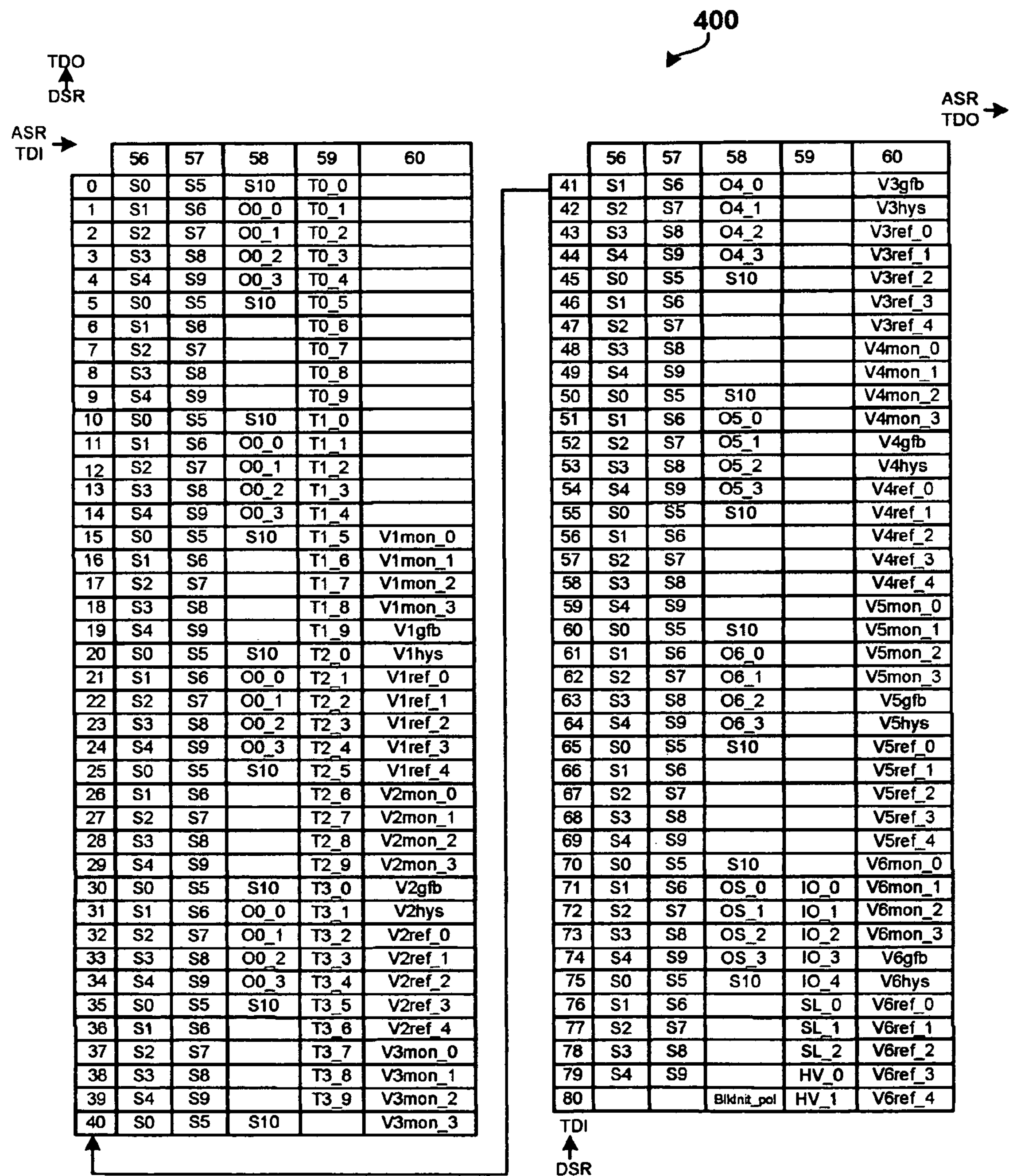

| | 56 | 57 | 58 | 59 | 60 |
|---|---|---|---|---|---|
| 0 | S0 | S5 | S10 | T0_0 | |
| 1 | S1 | S6 | O0_0 | T0_1 | |
| 2 | S2 | S7 | O0_1 | T0_2 | |
| 3 | S3 | S8 | O0_2 | T0_3 | |
| 4 | S4 | S9 | O0_3 | T0_4 | |
| 5 | S0 | S5 | S10 | T0_5 | |
| 6 | S1 | S6 | | T0_6 | |
| 7 | S2 | S7 | | T0_7 | |
| 8 | S3 | S8 | | T0_8 | |
| 9 | S4 | S9 | | T0_9 | |
| 10 | S0 | S5 | S10 | T1_0 | |
| 11 | S1 | S6 | O0_0 | T1_1 | |
| 12 | S2 | S7 | O0_1 | T1_2 | |
| 13 | S3 | S8 | O0_2 | T1_3 | |
| 14 | S4 | S9 | O0_3 | T1_4 | |
| 15 | S0 | S5 | S10 | T1_5 | V1mon_0 |
| 16 | S1 | S6 | | T1_6 | V1mon_1 |
| 17 | S2 | S7 | | T1_7 | V1mon_2 |
| 18 | S3 | S8 | | T1_8 | V1mon_3 |
| 19 | S4 | S9 | | T1_9 | V1gfb |
| 20 | S0 | S5 | S10 | T2_0 | V1hys |
| 21 | S1 | S6 | O0_0 | T2_1 | V1ref_0 |
| 22 | S2 | S7 | O0_1 | T2_2 | V1ref_1 |
| 23 | S3 | S8 | O0_2 | T2_3 | V1ref_2 |
| 24 | S4 | S9 | O0_3 | T2_4 | V1ref_3 |
| 25 | S0 | S5 | S10 | T2_5 | V1ref_4 |
| 26 | S1 | S6 | | T2_6 | V2mon_0 |
| 27 | S2 | S7 | | T2_7 | V2mon_1 |
| 28 | S3 | S8 | | T2_8 | V2mon_2 |
| 29 | S4 | S9 | | T2_9 | V2mon_3 |
| 30 | S0 | S5 | S10 | T3_0 | V2gfb |
| 31 | S1 | S6 | O0_0 | T3_1 | V2hys |
| 32 | S2 | S7 | O0_1 | T3_2 | V2ref_0 |
| 33 | S3 | S8 | O0_2 | T3_3 | V2ref_1 |
| 34 | S4 | S9 | O0_3 | T3_4 | V2ref_2 |
| 35 | S0 | S5 | S10 | T3_5 | V2ref_3 |
| 36 | S1 | S6 | | T3_6 | V2ref_4 |
| 37 | S2 | S7 | | T3_7 | V3mon_0 |
| 38 | S3 | S8 | | T3_8 | V3mon_1 |
| 39 | S4 | S9 | | T3_9 | V3mon_2 |
| 40 | S0 | S5 | S10 | | V3mon_3 |

| | 56 | 57 | 58 | 59 | 60 |
|---|---|---|---|---|---|
| 41 | S1 | S6 | O4_0 | | V3gfb |
| 42 | S2 | S7 | O4_1 | | V3hys |
| 43 | S3 | S8 | O4_2 | | V3ref_0 |
| 44 | S4 | S9 | O4_3 | | V3ref_1 |
| 45 | S0 | S5 | S10 | | V3ref_2 |
| 46 | S1 | S6 | | | V3ref_3 |
| 47 | S2 | S7 | | | V3ref_4 |
| 48 | S3 | S8 | | | V4mon_0 |
| 49 | S4 | S9 | | | V4mon_1 |
| 50 | S0 | S5 | S10 | | V4mon_2 |
| 51 | S1 | S6 | O5_0 | | V4mon_3 |
| 52 | S2 | S7 | O5_1 | | V4gfb |
| 53 | S3 | S8 | O5_2 | | V4hys |
| 54 | S4 | S9 | O5_3 | | V4ref_0 |
| 55 | S0 | S5 | S10 | | V4ref_1 |
| 56 | S1 | S6 | | | V4ref_2 |
| 57 | S2 | S7 | | | V4ref_3 |
| 58 | S3 | S8 | | | V4ref_4 |
| 59 | S4 | S9 | | | V5mon_0 |
| 60 | S0 | S5 | S10 | | V5mon_1 |
| 61 | S1 | S6 | O6_0 | | V5mon_2 |
| 62 | S2 | S7 | O6_1 | | V5mon_3 |
| 63 | S3 | S8 | O6_2 | | V5gfb |
| 64 | S4 | S9 | O6_3 | | V5hys |
| 65 | S0 | S5 | S10 | | V5ref_0 |
| 66 | S1 | S6 | | | V5ref_1 |
| 67 | S2 | S7 | | | V5ref_2 |
| 68 | S3 | S8 | | | V5ref_3 |
| 69 | S4 | S9 | | | V5ref_4 |
| 70 | S0 | S5 | S10 | | V6mon_0 |
| 71 | S1 | S6 | OS_0 | IO_0 | V6mon_1 |
| 72 | S2 | S7 | OS_1 | IO_1 | V6mon_2 |
| 73 | S3 | S8 | OS_2 | IO_2 | V6mon_3 |
| 74 | S4 | S9 | OS_3 | IO_3 | V6gfb |
| 75 | S0 | S5 | S10 | IO_4 | V6hys |
| 76 | S1 | S6 | | SL_0 | V6ref_0 |
| 77 | S2 | S7 | | SL_1 | V6ref_1 |
| 78 | S3 | S8 | | SL_2 | V6ref_2 |
| 79 | S4 | S9 | | HV_0 | V6ref_3 |
| 80 | | | Blklnit_pol | HV_1 | V6ref_4 |

| Data Register Location | Overriden Bits | Description |
|---|---|---|
| 0 | S0 | PLD macrocell |
| 1 | S1 | PLD macrocell |
| 2 | S2 | PLD macrocell |
| 3 | S3 | PLD macrocell |
| 4 | S4 | PLD macrocell |
| 5 | S5 | PLD macrocell |
| 6 | S6 | PLD macrocell |
| 7 | S7 | PLD macrocell |
| 8 | S8 | PLD macrocell |
| 9 | S9 | PLD macrocell |
| 10 | S10 | PLD macrocell |
| 11 | O0 | ORP |
| 12 | O1 | ORP |
| 13 | O2 | ORP |
| 14 | O3 | ORP |
| 15 | T0 | Timers |
| 16 | T1 | Timers |
| 17 | T2 | Timers |
| 18 | T3 | Timers |
| 19 | T4 | Timers |
| 20 | T5 | Timers |
| 21 | T6 | Timers |

| Data Register Location | Overriden Bits | Description |
|---|---|---|
| 22 | T7 | Timers |
| 23 | T8 | Timers |
| 24 | T9 | Timers |
| 25 | VMON0 | Vmon MON tap |
| 26 | VMON1 | Vmon MON tap |
| 27 | VMON2 | Vmon MON tap |
| 28 | VMON3 | Vmon MON tap |
| 29 | VGFB | Vmon glitch filter |
| 30 | VHYS | Vmon hysteresis |
| 31 | VREF0 | Vmon REF tap |
| 32 | VREF1 | Vmon REF tap |
| 33 | VREF2 | Vmon REF tap |
| 34 | VREF3 | Vmon REF tap |
| 35 | VREF4 | Vmon REF tap |
| 36 | IO0 | GPIO mux |
| 37 | IO1 | GPIO mux |
| 38 | IO2 | GPIO mux |
| 39 | IO3 | GPIO mux |
| 40 | IO4 | GPIO mux |
| 41 | HV1 | HVout bypass |
| 42 | HV2 | GPIO mux |
| 43 | POL | PLD block initial polarity |

| | ERASE | PROGRAM | Normal |
|---|---|---|---|
| PROW | $V_{DD}$ | $V_{PP}+V_T$ | $V_{DD}$ |
| V(Prog) | 0 | $V_{PP}/0$ | 0 |
| PTG | $V_{PP}$ | 0 | 0 |
| CONFBIT | 0 | 0 | $V_{DD}/0$ |
| RSEL | 0 | 0 | $V_{DD}$ |
| CG | $V_{PP}+V_T$ | 0 | 0 |

| | ConfBit Output | |
|---|---|---|
| | Floating Gate High | Floating Gate Low |
| TEST_BIT = 0 | 1 | 0 |
| TEST_BIT = $V_{DD}$ | 1 | 1 |

FIG. 7

PROGRAMMABLE LOGIC DEVICE AND METHOD OF TESTING

TECHNICAL FIELD

The present invention is directed to programmable logic devices (PLD) and, more specifically, to programmable logic devices with electrically erasable ($E^2$) configuration memory and methods for testing such PLDs.

BACKGROUND

Programmable integrated circuits generally are known to lend circuit designers flexibility in the design of electrical circuits. Before the advent of programmable integrated circuits, previous technologies often required board-level implementation of circuit designs, wherein various chips of fixed logic gates would be interconnected with fixed wiring configurations. If warranted, a custom integrated circuit might then be developed to further evolve the board solution into a custom integrated circuit of higher-density and smaller size. But as was often the case, an inadvertent error in the initial circuit design, tape-out and/or mask generation for the custom integrated circuit or perhaps even a simple change in the design criteria would force a costly fix, re-engineering or repeat design cycle.

With the development of programmable integrated circuits such as Programmable Logic Devices (PLDs), the process of digital or even analog hardware design has changed dramatically. Various devices such as processors, memory, logic circuits for state machine controllers, counters, registers, decoders and comparators may now be more readily realized for various configurations and even re-worked within prototypes or low-volume applications, as known, by assistance of programmable integrated circuit devices such as the PLDs. The Programmable Logic Devices may thus be understood to offer benefits of substantially instantaneous turnarounds, reduced costs, reduced risks and ease in engineering.

A typical PLD may include a plurality of programmable resources such as an AND plane and an OR plane of known Programmable Array Logic (PAL) type structure. The logic plane(s) may be programmable via known configuration memory as allocated to particular wiring-links for the plane for enabling the programmable resources to be configurable to various user defined functions. In some cases, flip-flops may also be connected or configurable for connection to the outputs of the OR-gate outputs so that sequential circuits can be further realized. The device may also include bi-direction I/Os around the periphery. These I/Os in turn may be connected to Generic Logic Blocks (as a form of small PAL) and/or also the Global Routing Pool(s). Such variations for the PAL type architecture may further be understood by some artisans to be incorporated with such PLDs.

Standard PLDs are known to include configuration memory operable to receive and store configuration data by which to configure the programmable resources of the PLD as allocated thereto. In the case of non-volatile type configuration memory for PLDs, the memory may comprise electrically erasable programmable non-volatile memory (i.e., EEPROM or $E^2$ cells) as known. Accordingly, the PLD may be purchased by system designers or manufactures in a "blank" state and then configured as desired by the user into virtually an unlimited number of specific functions. Being electrically erasable, the system designers may then be able to quickly create modifications to the initial custom logic function without having to endure great sacrifice in a project timeline.

It may be further recognized that manufactures of PLDs seem to continually push for realizations of smaller size and ever increasing density, presumably for enhancing manufacturing cost efficiencies. Such density increases and geometry reductions may in turn be found to place a greater premium on testing. As the densities increase for PLDs, the test processes and associated test times may be understood to contribute toward a greater portion of the overall costs in the production of the devices. To verify operability of the configurable resources of the PLD, each of the various possible configurations for the configurable logic blocks and various interconnect structures may need to be implemented which in turn may be understood to require a significant amount of time for erasing and reprogramming of the $E^2$ cells. For some PLDs, this erase and reprogram overhead for testing may accrue to as much as one third of an overall cost therefore, more especially so as their die size decreases.

For some known PLDs, volatile bits may be formed on the device (essentially as redundant bits) to be effective and operable to "mirror" each of the non-volatile programmable bits. During test, the redundant mirror bits may be employed to set the configurations of the PLD during test. However, while the added expense for these mirror bits to assist testing of the PLD may not be particularly bothersome for large scale integrated circuits, the real estate overhead may become more significant for small size PLDs. Further, the additional latches or registers constituting the source for the test date configuration may be understood as more of an alternative avenue by which to configure the programmable resources. Thus, this approach may essentially by-pass the data path from the configuration memory to the configurable resources, and may be found to not "truly mirror" the configuration memory for enabling testing of data paths from the configuration memory cells to the respective configurable programmable resources. In other words, the programmable interconnect between the actual $E^2$ cells and their destination may not be effectively tested and verified.

SUMMARY

In accordance with an embodiment of the present invention, a programmable logic device may comprise a plurality of programmable resources and non-volatile configuration memory operable to store configuration data for configuring the programmable resources. Test override circuitry may be operable to determine a test mode and selectively override configuration data of the configuration memory during the test mode so as to configure the programmable resources based on test configuration data from a source other than the configuration data of the non-volatile memory.

In a further embodiment, the test override circuitry may comprise a data register operable for receiving serial input data and a control register for receiving predetermined test mode signals. Responsive to determining a test mode condition in the control register, a controller may enable the test override circuitry to override the configuration data of the non-volatile memory and use the data from the data register as the basis for configuring the programmable resources. The drive capability lent to the data register for the test data may establish current levels greater than that otherwise available from the memory cells of the configuration memory—i.e., to be capable of overriding the configuration memory.

In a further embodiment, the configuration memory may comprise non-volatile memory and a buffer operable to drive a configuration select node for at least one of the programmable resources for designating a configuration therefore based upon the configuration data of the non-volatile memory. The test override circuitry may comprise a pull-down circuit operable, when enabled, to drive the buffer with a high/low level for configuring the programmable resource dependent on the test configuration data. Gateable logic may be selectively operable, dependent upon determining a test mode condition, to enable select operability of the pull-down circuit based on the test configuration data of the data shift register.

In another embodiment, a circuit may comprise a plurality of programmable resources configurable based upon configuration data. Electrically erasable programmable non-volatile memory may be operable to receive and store configuration data for configuring at least one programmable resource of the plurality. A buffer may be adapted to buffer data of the electrically erasable programmable non-volatile memory for availability as the configuration data by which to configure the programmable resources. A test override circuit may determine a test mode and selectively drive, dependent upon the test mode determination, the buffer based on test configuration data obtained from a source other than the electrically erasable programmable non-volatile memory.

In a further embodiment, the electrically erasable non-volatile memory ($E^2$ cells) may comprise a floating gate driving an amplifier of given output current capability. An inverter may be coupled to receive the output of the amplifier. The test override circuit may comprise a pull-down/up circuit coupled to the interconnect between the amplifier and the buffering inverter. The pull-down/up circuit may be selectively operable, dependent on the test configuration data, with capacity sufficient to override the current capability of the configuration memory's output amplifier.

In a method of testing a programmable logic device, in accordance with another embodiment of the present invention, test configuration data may be shifted into a volatile portion of selected cells of a non-volatile configuration memory within the device to override data otherwise provided by a non-volatile portion of the selected cells. A configuration select node of a programmable resource may be driven with at least the test configuration data of the selected cells. The drive capacity associated with the test configuration data may comprise magnitude sufficient to override that which might otherwise be provided by configuration data of non-volatile configuration memory allocated for configuring the programmable resources.

In a further embodiment, the data may be sourced from data shift registers to be conditionally applied to override a state otherwise presented to the configuration select node of the programmable resources, dependent upon an initial determination for the test mode condition.

BRIEF DESCRIPTION OF DRAWINGS

Subject matter of embodiments for devices and methods of manufacture to the present invention may be understood by reading the following description with reference to the accompanying drawings in which:

FIG. 4 is a table showing an example of mapping of configuration memory relative to programmable resources of a PLD in accordance with an embodiment of the present invention.

FIG. 5 is a table showing an example of test configuration data of data shift registers mapped to various select groups of programmable resources of the PLD of similar operability and configurability, in accordance with an embodiment of the present invention.

FIG. 6 is a table showing three separate columns associated with different operative modes of an electrically erasable programmable memory cell ($E^2$ cell) and the different voltage levels therefore that might be expected at the various nodes of the $E^2$ cell, as may be used to assist an understanding of an $E^2$ cell for certain embodiments of the present invention.

FIG. 7 is a table showing a logic table representative of the override operability of test configuration data relative to configuration data for an $E^2$ cell in accordance with an embodiment of the present invention.

DETAILED DESCRIPTION

Figure 1A:
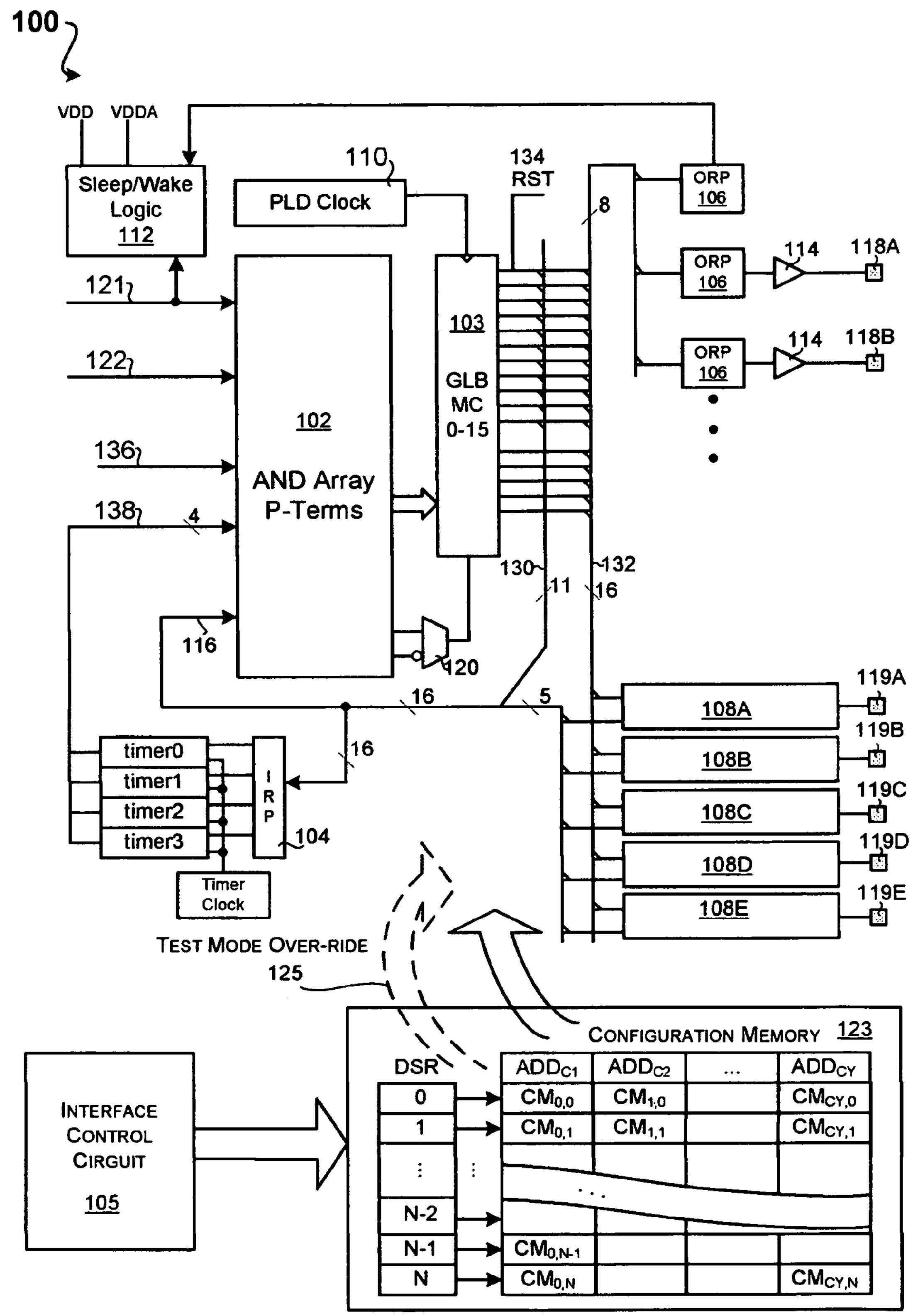
FIG. 1A is a simplified block diagram of a programmable logic device (PLD), showing programmable resources, configuration memory to store configuration data for configuring the programmable resources and a test mode override circuit adapted to override levels of the configuration memory for alternatively configuring the programmable resources based on test configuration data in accordance with an embodiment of the present invention.

In the description that follows, readily established circuits and procedures for the exemplary embodiments may be disclosed in simplified form (e.g., simplified block diagrams and/or simplified description) to avoid obscuring an understanding of the embodiments with excess detail where persons of ordinary skill in this art can readily understand their more specific structures and formations by way of the drawings and disclosure. For the same reason, identical components may be given the same reference numerals, regardless of whether they may be shown in different embodiments of the present invention.

As referenced herein, portions of a circuit may be described as being formed in, at or on an electrical device. Such alternative terms in/at/on may be used individually merely for purposes of convenience. In the context of forming semiconductor devices, such terms may collectively reference portions of a semiconductor chip that may be within and/or on other starting material.

Referencing FIG. 1A, programmable logic device 100 may comprises a plurality of programmable resources configurable for select configurations dependent upon configuration data of non-volatile configuration memory 123. The configuration memory 123 typically may comprise a plurality of non-volatile memory cells CM mapped by way of a plurality of rows 0-N and columns $C_1$-$C_Y$ of a given array structure. When programming PLD 100 for a given configuration, for example, interface control circuit 105 typically may initiate the writing or programming of the configuration memory. The programming may typically include transfer of configuration data from access data shift registers of the memory module into the non-volatile memory cells. For example, particular data shift registers DSR of the access interface may be associated with different rows of the array while the array is addressed column-by-column, as represented by the DSR row assignments for the mapping in FIG. 1A. Further referencing FIGS. 1A and 2, when writing the data from data shift registers 201 to the non-volatile memory cells of the configuration memory, Program Controller 205 and the Configuration Circuit 207 may generate the programming voltages—e.g., V(Prog), $P_{ROW}$CG, PTG, $R_{SEL}$—as required and known for programming the non-volatile memory with the configuration data.

In this programming mode of operation for the PLD, therefore, the data shift registers 201 may be described as an interface for configuration memory 123—e.g., of row/column write circuitry for the memory module. In other contexts such as a test mode of operation, the data shift registers 201 may be referenced as a data interface available for other uses, which may include overriding the configuration data of the configuration memory. The data shift registers may thus be described as part of a given interface within memory or alternatively in some contexts within a controller.

Further referencing the dual- or multi-use applications for the data shift registers, a portion of the data shift registers, in accordance with a further embodiment of the present invention, may be adapted to assist triggering of the test mode of operation. In this embodiment, a first portion of the data shift registers may be configured to receive test configuration data to assist with configuration of the programmable resources of the PLD while another portion of the data shift registers may be used as a test mode-enable register (not illustrated separately). To initiate a test mode of operation, predefined key-data may be placed into the test mode-enable register. A test controller within program controller 205 of FIG. 2 or the interface control circuit 105 of FIG. 1A may monitor this test mode-enable register for determining presence of the predefined key-data. Responsive to determining the key-data, the controller may signal the test mode.

Figure 1B:
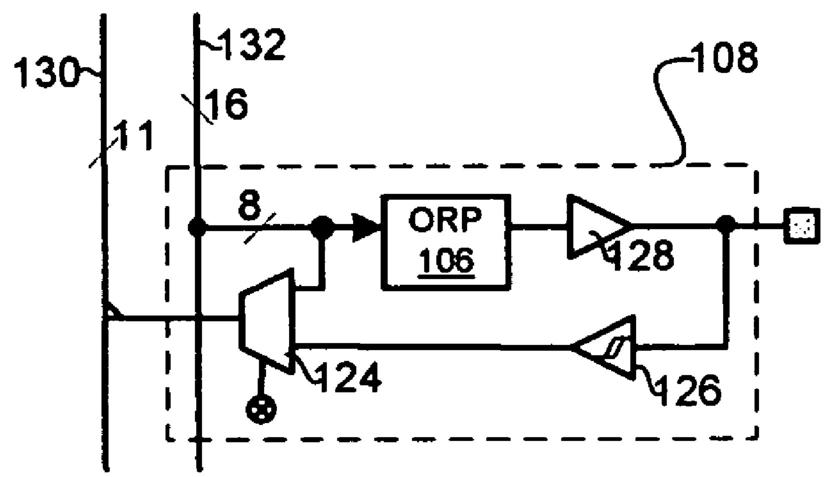
FIG. 1B is a simplified schematic diagram representative of an exemplary programmable resource for a PLD which may be associated with routing select signals between an interface node or bus to another interface node or bus, as may be used to assist an understanding of certain embodiments of the present invention.
Figure 1C:
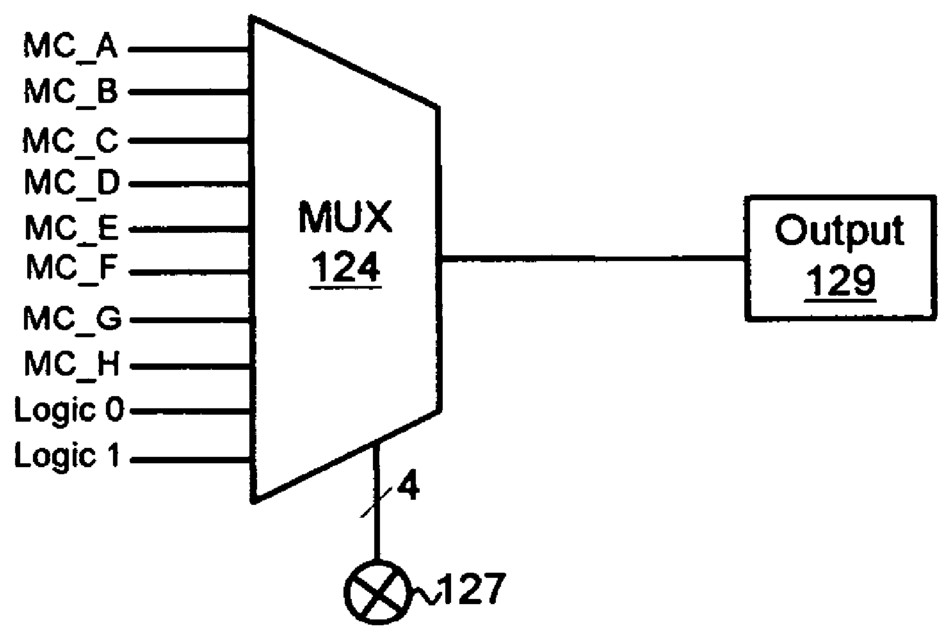
FIG. 1C is a simplified schematic diagram of a particular programmable resource for a PLD, showing configuration select lines by which to receive configuration data for selecting a given configuration for a multiplexer, and operable to further assist an understanding of certain embodiments of the present invention.

To assist further understanding of allocation of non-volatile memory cells to particular programmable resources of the PLD, further description for an embodiment may continue with further reference to FIGS. 1A-1C. PLD 100 may comprise known programmable array logic (PAL) block structures 102 of an AND-array operable together with product term allocators by which various sets of combinational logic may be defined for supporting the macrocells of, e.g., a global macrocell logic block 103. Particular cells of configuration memory 123 may be associated with particular product term nodes for, e.g., the AND-array 102. These cells may be selectively programmed with configuration data for implementing, as known, various functional states for a sequential state machine with realizations formed collectively with macrocells 103.

In a particular embodiment of the present invention, the AND-array 102 may include, e.g., 28 possible inputs and 81 possible product terms. Additionally, a given state machine realization may be capable of using up to five feedback avenues as selectively configured or defined by way of five different macrocells of input/output blocks 108 (labeled individually as blocks 108A-E). FIG. 1B shows structural detail of an input/output block 108. These input/output blocks, as known, may be configured selectively for routing select output terms of the global logic block 103 (further referencing FIG. 1A) as feedback to the AND-array 102. Alternatively, it may be understood that input/output blocks 108 may be programmed to select input signals of the input/output ports 119A-119E.

Typical configuration of the input/output routing blocks 108, further referencing FIGS. 1A and 1B, may require programming of configuration memory cells of configuration memory 123 that are allocated to a selection means within the I/O block. Such selection means may include, for example, multiplexer 124 (referencing FIGS. 1B, 1C). In a particular example, multiplexer 124 may receive a plurality of selectable inputs from various macrocells of PLD 100, as may be presented thereto via bus 132. Other inputs may include, e.g., true and complementary signals of an I/O port (e.g., ports 119) as may be buffered thereto by a differential amplifier 126. Accordingly, further referencing FIG. 1C, multiplexer 124 may comprise four configuration select nodes/lines 127 from which to selectively configure the multiplexer for selecting one of perhaps 16 possible inputs for electrical coupling to its output 129, dependent on the configuration data presented at its configuration select nodes 127.

In further embodiments, additional programmable resources of PLD 100 may include other internal programmable structures such as, for example, known output routing pools (ORP) 106 for determining one of a plurality of possible bus lines 132 from which to select as high voltage output signals for driving output nodes 118A, 118B. Further, some of these bus lines may include output FET drivers 114 that might also be programmable for selecting given output levels. The configurable elements of ORP 106 and high-voltage output drivers 114 may be mapped to particular configuration memory cells CM of configuration memory 123 and likewise may be configurable by way of user-defined data written therein.

Additionally, clock and timing circuitry 104 of the PLD may comprise clock and timing elements as known and by which to assist synchronizations and/or clocking of various signals to particular inputs for the AND-array 102 and/or for tailoring, as known, certain operations therefor.

Other inputs 136 to the AND-array 102 could be driven by programmable comparator circuits as known in the art and may similarly be mapped to particular memory cells CM of configuration memory 123. The threshold levels to the comparators (not shown) may thus be adjustable or configurable as known by way of the configuration data that are programmed into their memory cells of the configuration memory.

Further inputs to the AND-array 102 may include direct input 121, which in turn may be shared for selective coupling to sleep/wake logic 112. Thus, for certain user-defined configurations, an appropriate indicator signal, such as that which may be present at direct input 121 (or perhaps others via different programmable resources such as the output routing paths), may provide a control signal to sleep/wake logic 112. Likewise, resources such as a known phase lock and delay resource 110 may similarly have memory cells CM of configuration memory 123 mapped thereto by which to enable select configuration from various alternatives.

Referencing FIGS. 1A and 4, different memory cells CM of a plurality for configuration memory 123, in accordance with a particular embodiment, may have addressable mappings for allocations to assigned programmable resources of the programmable logic device. Further referencing FIG. 4, serial data shift registers DSR of multiple locations 0-80 as represented along the leftmost portion of table 400, may map various macrocell configuration bits 0-4 as may be associated with perhaps up to 20 different macrocells of PLD 100. For example, 0-15 multiplexers within global logic block (GLB) 103 may be allocated to respective sequential portions of a first addressable column (56) of the configuration memory and as mapped by data shift register locations DSR (0-59). Other 16-20 multiplexers could be associated with additional macrocells as may be allocated to respective sequential portions of the first column of the configuration memory and as mapped by data shift register locations DSR (60-79).

Similarly, referencing FIG. 4, a second addressable column (57) of the configuration memory as represented in table 400 may be mapped for higher-order selection bits S5-S9 for the various macrocells within the configurable elements for PLD 100.

Further referencing FIGS. 1A and 4, a third addressable column (58) of table 400 for the bit mapping to a plurality of memory cells of configuration memory 123 may be associated with configuration of output routing resources. As may be known in the art, output routing pools 106 may be configurable for high-voltage output paths such as output lines 118A, 118B and the output routing pools within the feedback macrocells may be configurable for global I/O ports such as paths 119A-119E.

Continuing with this particular example for mappings and allocation of configuration memory 123 to the programmable resources, a fourth addressable column (59) of the configuration memory as represented in table 400 may be mapped for architecture configuration bits that are to be associated with configuration of various programmable timers, such as Timer0, Timer1, Timer2 and Timer3, as illustrated in FIG. 1A. For example, the first timer Timer0 may be configurable via timing bits $t_0$-$t_9$.

Further referencing FIG. 4, a fifth addressable column (60) of the configuration memory as represented in table 400 may be mapped, as known, for architecture configuration bits that may be associated, in this particular embodiment, with setting various reference levels for supply voltages on-board the programmable logic device and/or for adjusting the threshold levels to comparators that may be used for monitoring particular signal levels for the programmable logic device.

It may be understood that the various resources described above for the exemplary programmable logic device may have been referenced simplistically and without reference to all features that may be available for PLD 100. Further, this particular mapping structure (FIG. 4) would be understood as representative merely of one embodiment for a programmable logic device. Other embodiments of the present invention may have additional known programmable resources which may likewise be allocated to other cells of configuration memory 123.

In yet other embodiments, multiple units of PLD 100 may be integrated together into perhaps a more complicated programmable logic device, as known in the art, and yet may likewise incorporate test override circuitry of the programmable logic device embodiments within the spirit and scope of the present invention as set forth in the appended claims.

In accordance with a particular embodiment, further referencing FIG. 1A, a test mode may be detected by control circuitry of PLD 100 which may be defined in part by a controller within the interface control circuit 105. Upon detecting a test mode, the controller may enable outputs from the data shift register to be more directly routed to the programmable resources so as to override (in this embodiment, not to be confused with over-write) data of configuration memory 123. Test configuration data of the interface-control circuit 105 may thus override the data that might otherwise be presented to the configuration select node of the programmable resources by the configuration memory. In this manner, during the test mode of operation for testing of the programmable logic device, it may be possible to more readily alter and establish the configuration states for testing the various data paths of the programmable logic device without having to repetitively and laboriously reprogram the electrically erasable programmable memory cells ($E^2$ cells) of configuration memory 123 for each of a plurality of different test configurations.

It may be further understood that particular elements for certain resources of the programmable logic device may be characterized with similar operability and configurability. For example, multiplexers 124 associated with different output routing pools 106 may each have a similar input to output structure that may be configured similarly during testing (FIG. 1B). Thus, the bit map (FIG. 4) for the configuration architecture bits for testing, in certain embodiments of the present invention, may be compressed simplified greatly relative to the multiple-column (e.g., five-column) mapping as might otherwise be required during the configuration mode of operation as referenced previously.

Referencing FIG. 5, table 500 show an example of mapping test configuration bits of the data shift registers to 44 data register locations DSR (0-43) of the data shift register to select groups of programmable resources of the PLD of similar operability and configurability. The 44 data register locations may thus be sufficient for establishing the test override bits by which to exercise the various possible configuration states as required for testing the data paths (i.e., user data paths) of the programmable logic device. For example, data shift register locations DSR (0-10) might be associated with programming of the various macrocells of the programmable logic device. Accordingly, each macrocell of the plurality may be similarly configured by the shared macrocell configuration bits S0-S10. The data register locations DSR (11-14) could be shared in common for respective configuration select nodes 0-3 of the various output routing pools. Similarly, the data shift register locations DSR (15-24) might be used in common for the timer configuration bits $t_0$-$t_9$ for each of the timers Timer0-Timer3. Likewise, verniers to different monitor inputs for comparators may also share common configuration data among the data register locations DSR (25-28) per vernier monitor bits $VM_0$-$VM_3$. Other resources may include a glitch filter, a hysteresis reset setting, voltage reference taps and global I/O port multiplexers and the like as may be known for programmable logic devices.

In this manner as illustrated with reference to FIGS. 4 and 5, rather than having to write five separate columns for programming the non-volatile configuration memory for configuring the programmable logic device during testing, a single and shortened data shift register load procedure may be employed. This may be done, in accordance with the embodiments of the present invention, by inputting the test data into the data shift registers. The programmable resources may thus be configured during test mode operability by data shift register loads absent the need for programming of the $E^2$ cells and associated multiple-column write procedures. Thus, test time may be significantly reduced relative to that which might otherwise be typically required for testing the various data paths of the programmable logic devices.

Figure 2:
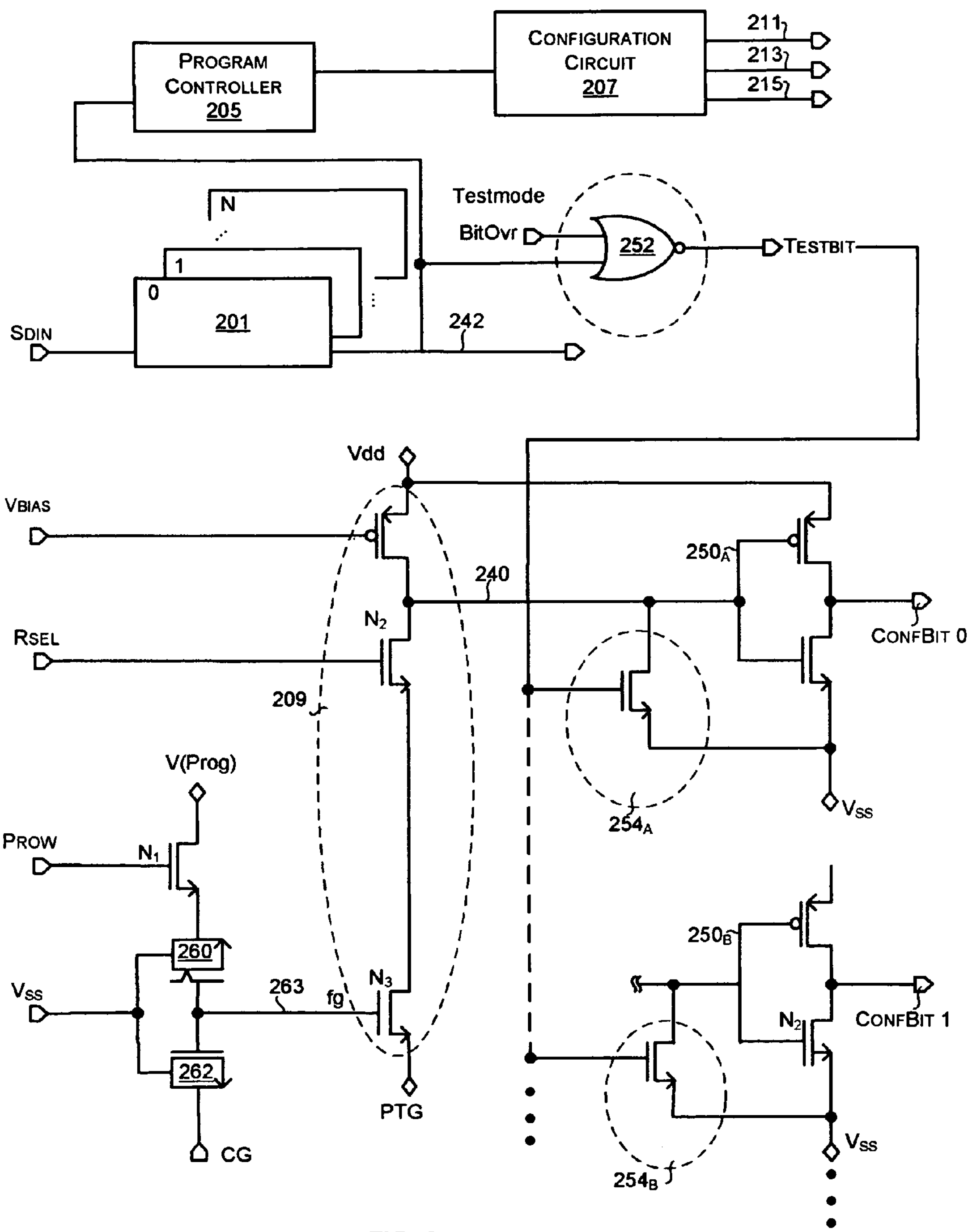
FIG. 2 is a simplified schematic diagram of a portion of a programmable logic device (PLD), in accordance with an embodiment of the present invention, showing an $E^2$ cell, configuration memory and bit override circuitry selectively operable to drive a configuration select node for configuring a programmable resource of the PLD.

In accordance with a particular embodiment of the present invention, referencing FIG. 2, bit-override test circuitry may be implemented by way of a pull-up/down circuit 254 and logic gate 252. During a test mode of operation, a bit-override signal may be applied to logic gate 252 such as a NOR gate. The signal may enable test configuration data from register 201 of the data shift registers (0-N) to be available for selectively enabling the pull-up/down circuit 254 dependent on the data. An output amplifier 209 of the $E^2$ cell may have a given output current or drive capability of magnitude less than that of the pull-up/down circuit 254. The truth table 700 of FIG. 7 may be referenced for assisting understanding of the bit-override circuitry, wherein configuration select node 240 between amplifier 209 and buffer 250 may be driven by the pull-up/down circuit 254 dependent on the test configuration data. Accordingly, the data shift registers of the serial input structure of the programmable logic device may be used to configure various test configurations of the PLD more directly so as to essentially override and bypass the laborious operations that might otherwise be required for programming configuration memory 123 (FIG. 1).

Continuing with reference to FIG. 6 relative to FIGS. 1A and 2, the $E^2$ cells of the configuration memory 123 may typically be operable in one of three operative modes: erase, program and normal operation. Table 600 of FIG. 6 indicates the voltage levels as may be expected at various nodes of the $E^2$ cells for the different operative modes of the configuration memory. For assisting understanding of operability for each typical $E^2$ cell, further referencing FIG. 2 relative to FIG. 6, various nodes—for example, $V_{DD}$, $R_{SEL}$, $V_{BIAS}$, $P_{ROW}$, $V_{SS}$, CG, and PTG—of the $E^2$ cell may be supplied or driven with predetermined voltage levels as known dependent upon the given operability for the $E^2$ cell. For example, when erasing the electrically erasable programmable non-volatile memory ($E^2$ cell), N-channel MOSFET $N_2$ associated with establishing a load to output amplifier 209 of the $E^2$ cell may have its gate $V_{BIAS}$ driven with a low voltage level so as to disable the NMOS transistor $N_2$ and isolate output node 240 relative to NMOS transistor $N_3$ of the $E^2$ cell which is driven by floating gate 263. The upper supply node $V_{DD}$ may be understood to be representative of an upper supply to the semiconductor device and likewise a lower supply node $V_{SS}$ representative of a lower supply. The programming access N-channel MOSFET $N_1$, by which the floating gate is accessed, may have its gate $P_{ROW}$ driven with a high voltage level such as $V_{DD}$, while its drain may receive a lower voltage level by way of the node V(prog).

The lower nodes of the $E^2$ cell such as CG and PTG, in turn, may receive high voltage levels such as $V_{PP}+V_T$ and $V_{PP}$, respectively. Accordingly, the capacitive coupling of capacitor 262 to floating gate 263 may drive the floating gate upward to a voltage potential comparable to $V_{PP}$. With the upper N-channel MOSFET $N_1$ remaining enabled by way of the high voltage level $V_{DD}$ applied to its gate, the upper capacitor 260 with the leakage tunneling point as known may eventually bleed off charge from floating gate 263 whereby the potential of floating gate 263 will ramp to the level of, e.g., a lower level supply V(prog) as made available thereto at the drain. After a given duration, the voltage levels at the various nodes may be returned to the normal operative conditions.

Further referencing table 600 of FIG. 6 and FIG. 2, the voltage levels applied to the various nodes of the $E^2$ cell during the normal condition may again present a high voltage level of $V_{DD}$ to $P_{ROW}$ for enabling operability of the programming access MOSFET $N_1$. Its drain may receive a low level voltage V(prog) of zero volts, while the lower nodes CG and PTG are returned to the low level voltage of zero volts. It may be understood that the voltage potential at floating gate 263 may then reduce to perhaps a potential less than zero volts.

Accordingly, the voltage potential at floating gate 263 may further drop from the "lower voltage level"—i.e., as previously established by the leakage through the tunneling node of capacitor 260—to a level less than this pre-established potential. Thus, the cleared state for the $E^2$ cell may be understood to provide a lower level voltage at the floating gate operable to disable the NMOS transistor $N_3$ associated with the output amplifier 209. Accordingly, when the output amplifier 209 is disabled, output node 240 may receive a high level voltage signal and the output configuration select node may be driven (via inverter 250) for a low level voltage.

In another known operative mode for the $E^2$ cell, further referencing FIG. 2 and the program column of table 600 of FIG. 6, it may be understood that the lower supply nodes CG and PTG of the $E^2$ cell may be driven with low levels of, e.g., zero volts, and the drain of the programming access NMOS transistor $N_1$ may receive a programming level voltage V(prog) of $V_{PP}$ by which to program the $E^2$ cell with a state opposite to that of its previous cleared condition; or alternatively, the programming node at the drain may receive a low-level voltage V(prog) such as zero volts so as to preserve the previously cleared state.

The various signal levels by which to operate the $E^2$ cell for the different operative modes—erase, program and normal operation,—may be driven, as known, by a configuration control circuit 207 in combination with a program controller 205. Such known program controller 205 and configuration control circuit 207 may provide various output levels, e.g., 211, 213, 215 as shown simplistically, for establishing the different operative modes of the $E^2$ cell as known, and may be dependent upon data of a register 201.

It may be further recognized, by way of this disclosure, that the clear and write times associated with typical programming of the electrically erasable programmable memory cells ($E^2$ cells) of programmable logic devices may ordinarily be quite lengthy. Typical testing of programmable logic devices, therefore, might require multiple clear and write procedures by which to program the $E^2$ cells so as to be able to select and exercise various settings for timers, macrocells of the PLD, output routing pools, threshold levels for comparators, etc. With each typical iteration requiring the clear and write procedure of the $E^2$ cells, the amount of time for full testing and as required for configuring each of the various possible configurations for the programmable logic device may thus become significant.

It may be further theorized herein that certain embodiments of the present invention may therefore enable testing of the PLD with greater efficiency, whereby the serial data shift registers of greater assessability may thus offer advantages over the typical test procedures, which might otherwise require the multiple clear and write programming operations of the non-volatile $E^2$ cells. Such time efficiency during test may thus be theorized to lend significant advantages and cost reductions for programmable logic devices.

For certain embodiments of the present invention, it may be noted that the override capability may be implemented by addition of a volatile portion to the existing non-volatile portion of an $E^2$ cell, e.g., of one MOSFET 254 for a pull-down/up circuit proximate the $E^2$ cell(s) and by addition of NOR gate 252 for logic pass-gate(s) proximate respective data shift register(s) 201.

In further embodiments, a test mode detection controller (as a part of interface controller 105 of FIG. 1A or program controller 205 of FIG. 2) may check, e.g., a predetermined register for keyed data predefined to be operable for signaling and invoking the test mode of operation. In a particular embodiment, the register may comprise a portion of the serial data registers 201 and the keyed-data for triggering the test mode may be predefined as a pattern outside the cope of patterns that may otherwise be expected or anticipated during normal operations of the PLD. Knowledge of the key may be restricted from general customers and limited to manufacturers' availability so as to limit access to the test circuitry of the programmable logic device.

Upon detecting key data for signaling the test mode of operation, the controller may assert the test mode signal for enabling logic gate 252 and enabling the test configuration data of the data shift registers to be forwarded for selectively enabling the pull-down circuit 254 and setting the state of the architecture set bits ConfBit_X at configuration select node 240. In further embodiments, continuing with reference to FIG. 2, the output from logic gate 252 may drive a plurality of pull-up/down circuits $\mathbf{254}_A$, $\mathbf{254}_B$, . . . as may be associated with the configuration select nodes to the programmable resources of similar operability and configurability within the PLD.

In a particular embodiment of the present invention, further referencing FIG. 2, the pull-down circuit 254 is realized by an N-channel MOSFET operable to pull down node 240 between amplifier 209 and buffer 250, when selectively enabled, dependent upon the test configuration data. However, it may be understood that alternative embodiments of the present invention may employ use of a pull-up circuit such as a P-channel MOSFET coupled between node 240 and the upper supply. Additionally, the NOR logic gate logic 252 might be realized, in alternative embodiments, by way of an NAND gate or a tri-state buffer.

Figure 3:
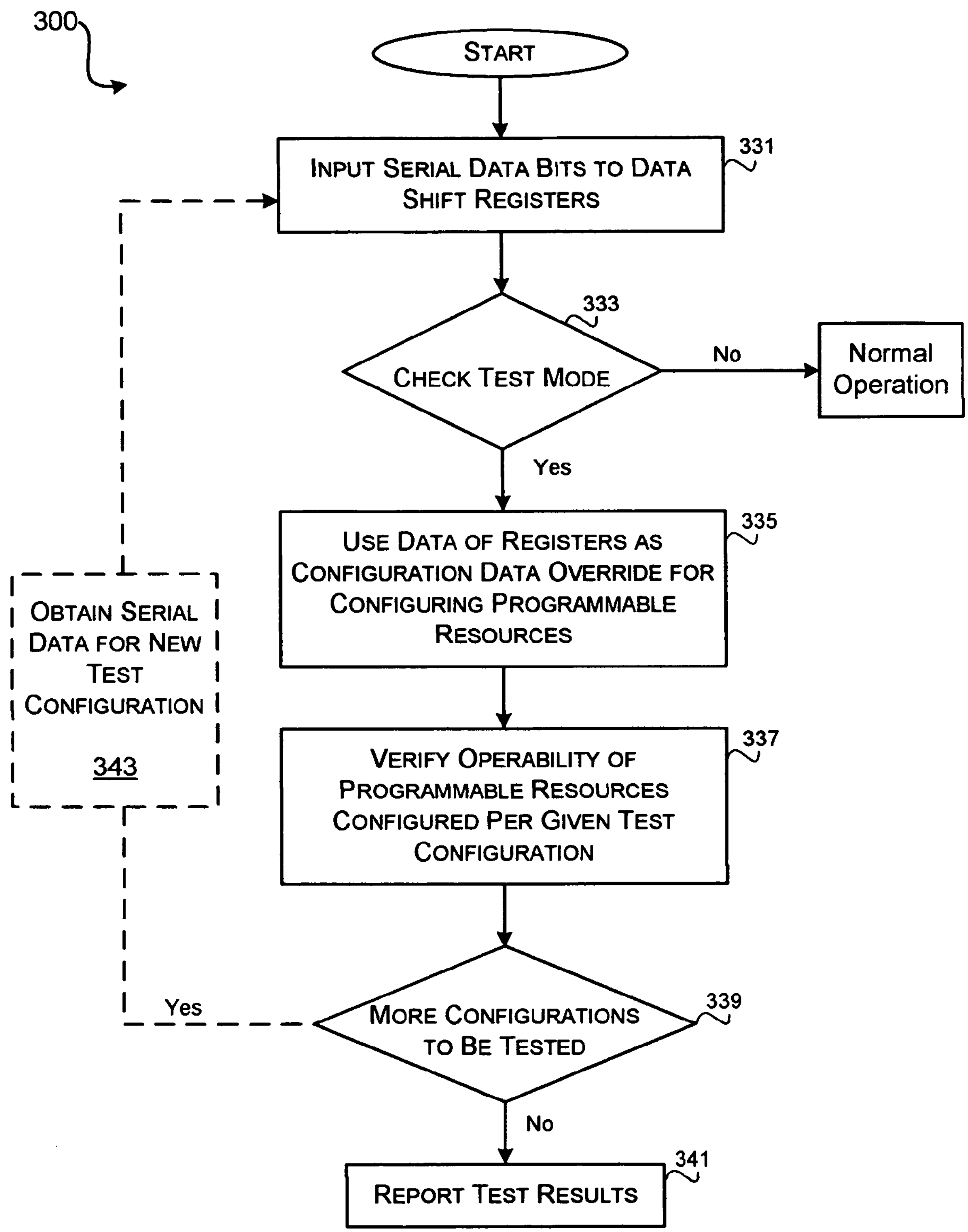
FIG. 3 is a simplified flow diagram, in accordance with an embodiment of the present invention, showing a method of testing a programmable logic device in accordance with an embodiment of the present invention.

In a method of testing 300 of a programmable logic device, in accordance with an embodiment of the present invention, further referencing FIGS. 1A, 2 and 3, serial data bits may be input (block 331 of FIG. 3) into data shift registers 201 (0-N) within memory 123. In absence of a test mode, the programmable logic device may progress to normal operations. The controller within interface control circuit 105 may determine (block 333 of FIG. 3) the presence of a test mode and continue a test mode procedure for enabling override of the configuration data stored in the non-volatile configuration memory (block 335 of FIG. 3) based upon the test configuration data of the data shift registers. Upon determining the test mode, the controller may assert a predefined test-mode override signal 125 by which to enable logic gate 252 and thereby selectively enable the pull-down circuit 254 and configure the programmable resources of the programmable logic device dependent at least in part upon the test configuration data. Thus, test configurations may be made dependent upon the test configuration data from a source other than configuration data stored in the non-volatile configuration memory.

In a particular embodiment, the configuration memory may initially be cleared (or otherwise set) to a known state as a part of entering the test mode. Thus, the selective enablement of the pull-down circuit may be operable to selectively change the cleared state of the configuration bit, ConfBit_X that is output to the configuration select node based on the test configuration data within the data shift register. Again, table 7 of FIG. 7 may be used to assist an understanding of the override operability.

Upon configuring the programmable resources of the programmable logic device in accordance with the test configuration data of the data shift registers, further referencing FIG. 3, the operability of the configuration data paths within the programmable logic device may then be tested as known in the art for verifying functionality of the particularly selected configuration (block 337 of FIG. 3).

If further testing is to be performed (block 339 of FIG. 3), new serial data may be obtained (block 343 of FIG. 3) for a new test configuration and the test procedures repeated for testing further data paths of the programmable logic device.

If no further test configurations are to be tested, test method 300 may conclude with reporting test results (block 341 of FIG. 3).

It may be noted, by way of the present disclosure, that there may be essentially two valid states for an $E^2$ cell, programmed or erased. In a particular embodiment of the present invention, the state of the $E^2$ cell is sensed by an output amplifier 209 and buffered by a CMOS inverter 250. At an intermediate node 240 between the amplifier and the buffer, pull-down/up circuit 254 may be configured and adapted for enabling the override of configuration memory in accordance with the test configuration data during the test mode of operation. During such operation, the test override circuitry may be described as taking advantage of a "free" zero state of the $E^2$ cell. That is, once the configuration memory has been cleared or erased, the zero is essentially "free." The test configuration data, therefore, may present a level (e.g., low) for keeping the pull-down circuit 254 disabled so as not to alter the level and state already presented to the configuration select node. To obtain the alternative state, a moderately sized NMOS transistor for the pull-down circuit 254 may be enabled so as to override the weak current capability, for example, 3 microamps, of the P-MOSFET for the pull-up transistor of the output amplifier 209. Accordingly, the output level presented to the configuration select node may be altered by the override operability of the test override circuitry.

Although the invention has been described and illustrated with reference to specific embodiments thereof, the invention is not limited to these embodiments. Those skilled in the art will recognize that variations and modifications can be made to these embodiments without departing from the principles of the invention. It is therefore intended to include within the invention all such variations and modifications that fall within the scope of the following claims.

What is claimed is:

1. A programmable logic device, comprising:

a plurality of programmable resources;

non-volatile configuration to store configuration data for configuring the plurality of programmable resources; and test-override circuitry operable to determine a test mode and selectively operable dependent upon the test mode determination to override by bypassing the configuration data stored in the non-volatile configuration memory and configure at least one of the plurality of programmable resources based on test data of a source different from the configuration data stored in the non-volatile configuration memory.

2. The device of claim 1, in which the source different from the configuration data stored in the non-volatile configuration memory comprises a data register, and the test-override circuitry is further operable during the test mode to receive the test data from the data register and configure the at least one programmable resource of the plurality based on the test data.

3. The device of claim 2, in which the data register is defined at least in part by data shift registers adapted to receive serial data, and the device further comprises:

an address register operable to present address data; and a controller operable to determine a configuration mode, and selectively operable, dependent upon such determining, to write a select portion of configuration memory with data of the data shift registers for an associated portion of the plurality of programmable resources, the select portion of the configuration memory based on the address data of the address register.

4. The device of claim 3, wherein the controller is further operable in the configuration mode to sequence at least two different addresses in the address register, and for each address sequenced, receive data in the data shift registers and write the data from the data shift registers into the corresponding select portion of the configuration memory as designated by the data in the address register.

5. The device of claim 2, in which the plurality of programmable resources defines at least in part multiple modules having similar configurable elements of similar operability, and the configurable elements of similar operability are adapted to be configured during the test mode in common dependent on the test data from the data register.

6. The device of claim 2, in which the configuration memory comprises:

programmable non-volatile memory;

a buffer operable to drive one of the at least one programmable resource for given configuration based on the state of the non-volatile memory; and the test-override circuitry comprises:

at least one pull-up/down circuit operable to drive the buffer with high/low level operable to configure the programmable resource based on the test data, the pull-up/down circuit of drive capacity sufficient to override an output level otherwise provided to the buffer by the non-volatile memory; and gateable logic selectively operable dependent upon the determining of the test mode to enable the at least one of the pull-up/down circuit based on the test data of the data register.

7. The device of claim 6, in which the at least one pull-up/down circuit comprises:

a first MOSFET disposed with its gateable channel between an upper/lower supply node and the input to the buffer and its gate driven by the gateable logic; and another MOSFET having its gate also driven by the gateable logic and its gateable channel disposed between the upper/lower supply node and an input to another buffer that is associated with configuring another programmable resource of the plurality.

8. The device of claim 7, in which the gateable logic comprises one of the logic circuits of the group consisting of a tri-state buffer, an AND gate and an NOR gate selectively operable when enabled dependent on a test mode signal to drive the gate(s) of at least one of the first and the another MOSFETs based on the test data.

9. A circuit comprising:

a plurality of programmable resources configurable based upon configuration data;

electrically erasable programmable non-volatile memory to store data for configuring at least one programmable resource of the plurality;

a buffer to buffer data of the electrically erasable programmable non-volatile memory for availability as configuration data for configuring the at least one programmable resource of the plurality; and a test-override circuit to determine a test mode and selectively drive, dependent on the determination of the test mode, the buffer with test configuration data from a source independent of the configuration data stored in the electrically erasable programmable non-volatile memory.

10. The circuit of claim 9, in which the electrically erasable programmable non-volatile memory comprises a floating gate driving an amplifier having an output current capability;

the buffer comprises an inverter with an input coupled to the output of the amplifier; and the test-override circuit comprises a pull-up/down circuit coupled to the input of the inverter and selectively operable dependent on the test configuration data when applied thereto to drive the inverter with capacity sufficient to override the output current capability of the amplifier of the electrically erasable programmable non-volatile memory.

11. The circuit of claim 10, further comprising a data shift register operable to receive serial data, and in which the test-override circuit further comprises a gateable logic device selectively operable dependent on the test mode determination to drive a control node of the pull-up/down circuit based on the test configuration data obtained from a given register of the data shift register.

12. The circuit of claim 11, in which the gateable logic circuit comprises one of an AND or NOR gate having one input to receive the test configuration data of the given register of the data shift register and the other input to receive a test mode signal operable to selectively enable application of the test configuration data as logically processed therein to the control node of the pull-up/down circuit.

13. The circuit of claim 11, further comprising:

another of said electrically erasable programmable non-volatile memory associated with configuring another programmable resource of the plurality;

another of said buffer circuit by which to buffer data of the another electrically erasable programmable non-volatile memory as the configuration data during a normal operation mode for configuring the another programmable resource;

wherein the test-override circuit further comprises another of the pull-up/down circuit coupled to the input of the another buffer circuit and selectively operable dependent on the test configuration data applied thereto for enabling pull-up/down of the buffer input; and wherein the output of the gateable logic circuit is coupled in common to the control node of the another of the pull-up/down circuit.

14. The circuit of claim 13, further comprising a controller to control when to write data of the data shift register as configuration data into the electrically erasable programmable non-volatile memory upon determining a configuration mode and when to apply the data as the test configuration data of the data shift register more directly via the test-override circuit to configuration nodes of the programmable resources upon determining the test mode.

15. A programmable logic device, comprising:

programmable resources;

non-volatile configuration memory operable to store configuration data for configuring the programmable resources;

at least one data shift register operable to store configuration data and load such data into the non-volatile configuration memory; and test-override circuitry responsive to a test mode signal to configure the programmable resources with configuration data stored in the data shift register rather than with configuration data loaded into the non-volatile configuration memory.

16. The programmable logic device of claim 15, wherein the test-override circuitry comprises a logic circuit coupled between the data shift register and programmable resources and responsive to the test mode signal to direct configuration data from the data shift register directly to the programmable resources.

* * * * *

UNITED STATES PATENT AND TRADEMARK OFFICE

CERTIFICATE OF CORRECTION

PATENT NO. : 7,463,060 B1
APPLICATION NO. : 11/452714
DATED : December 9, 2008
INVENTOR(S) : Whitten et al.

It is certified that error appears in the above-identified patent and that said Letters Patent is hereby corrected as shown below:

Col. 12, line 39 (Claim 1): change “nonvolatile configuration to store configuration data” to --non-volatile configuration memory to store configuration data--

Signed and Sealed this

Twenty-ninth Day of December, 2009

David J. Kappos
*Director of the United States Patent and Trademark Office*